United States Patent
Swenson

(10) Patent No.: US 9,209,222 B2
(45) Date of Patent: Dec. 8, 2015

(54) SURVEILLANCE DEVICE

(71) Applicant: James W. Swenson, Minneapolis, MN (US)

(72) Inventor: James W. Swenson, Minneapolis, MN (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 426 days.

(21) Appl. No.: 13/714,904

(22) Filed: Dec. 14, 2012

(65) Prior Publication Data

US 2014/0168425 A1 Jun. 19, 2014

(51) Int. Cl.
*H04N 7/18* (2006.01)
*H01L 27/15* (2006.01)
*G08B 13/196* (2006.01)
*H04N 5/225* (2006.01)

(52) U.S. Cl.
CPC .......... *H01L 27/15* (2013.01); *G08B 13/19626* (2013.01); *H04N 7/18* (2013.01); *H04N 5/2256* (2013.01)

(58) Field of Classification Search
None
See application file for complete search history.

(56) References Cited

U.S. PATENT DOCUMENTS

| | | | |
|---|---|---|---|
| 4,567,551 A | 1/1986 | Choate | |
| 5,897,195 A | 4/1999 | Choate | |
| 7,245,429 B2 | 7/2007 | Yoshikawa et al. | |
| 7,993,007 B2 | 8/2011 | Fuse et al. | |
| 2005/0146875 A1* | 7/2005 | Klein | 362/253 |
| 2007/0275344 A1* | 11/2007 | Liu | 433/29 |
| 2007/0297051 A1* | 12/2007 | Huang et al. | 359/457 |
| 2009/0268023 A1* | 10/2009 | Hsieh | 348/143 |
| 2012/0044374 A1* | 2/2012 | Pohlert et al. | 348/220.1 |

* cited by examiner

*Primary Examiner* — William C Vaughn, Jr.
*Assistant Examiner* — Eileen Adams
(74) *Attorney, Agent, or Firm* — Cantor Colburn LLP

(57) ABSTRACT

A surveillance device includes a circuit card assembly disposed in a housing and a plurality of light emitting diodes disposed on the circuit card assembly, each of the plurality of light emitting diodes configured to emit a narrow beam of light. The surveillance device further includes a diffuser disposed in the housing, the diffuser configured to spread the narrow beam of light and a Fresnel lens disposed in the housing, the Fresnel lens configured to spread and redirect light emitted from the diffuser.

11 Claims, 5 Drawing Sheets

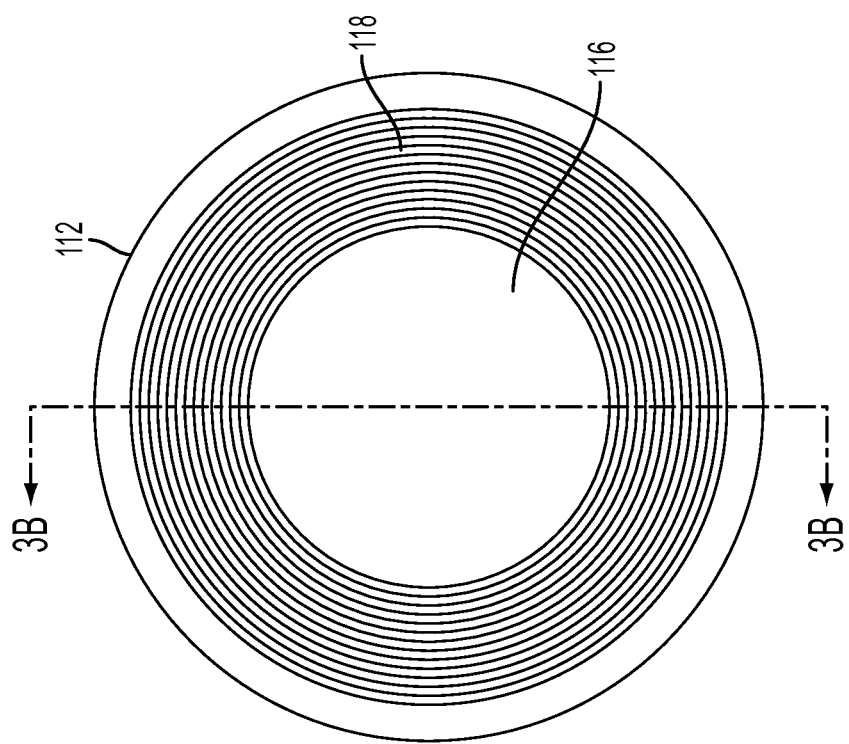

SURVEILLANCE DEVICE

BACKGROUND OF THE INVENTION

The present disclosure relates to the field of illuminators, and more specifically, to an infrared illuminator for a surveillance device.

Infrared illuminators are commonly used to providing lighting for cameras in surveillance systems and in other applications. These infrared illuminators generally use infrared light emitting diodes as the source of the light. A wide variety of infrared light emitting diodes are available that each has various characteristics, such as brightness, beam angle and the like.

In order to obtain the lighting desired for the cameras, many current infrared illuminators include light emitting diodes that have a wide beam angle. However, due to the construction of the infrared illuminators much of the light produced by the light emitting diodes doesn't escape the housing of the infrared illuminators and is therefore wasted. Alternatively, other available infrared illuminators include light emitting diodes disposed close to the exterior of the infrared illuminators to avoid wasting the light emitted. However, these designs require additional costs. Additionally, if the light emitting diodes are enclosed, light is lost internally and can be reflected into the lens, causing flair. If the light emitting diodes are not enclosed, the illuminators are vulnerable to tampering and environmental damage.

BRIEF DESCRIPTION OF THE INVENTION

According to one embodiment, a surveillance device includes a circuit card assembly disposed in a housing and a plurality of light emitting diodes disposed on the circuit card assembly, each of the plurality of light emitting diodes configured to emit a narrow beam of light. The illuminating device further includes a diffuser disposed in the housing, the diffuser configured to spread the narrow beams of light and a Fresnel lens disposed in the housing, the Fresnel lens configured to spread and redirect the light beams emitted from the diffuser to continuously cover a wider area. The Fresnel lens may be incorporated on the back side of the housing cover, reducing part count, cost and flammability issues.

Accordingly to another embodiment, a surveillance device includes a circuit card assembly disposed in a housing and a lens/imager disposed in the center of the circuit card assembly. The infrared illuminating device also includes a plurality of infrared light emitting diodes circumferentially disposed on the circuit card assembly around the lens/imager, each of the plurality of infrared light emitting diodes configured to emit a narrow beam of infrared light and a diffuser disposed in the housing, the diffuser configured to spread the narrow beam of infrared light. The infrared illuminating device further includes a Fresnel lens disposed in the housing, the Fresnel lens configured to redirect and spread the infrared light beams emitted from the diffuser to continuously cover a wider area.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 3A is a top view of a Fresnel lens in accordance with an embodiment of the disclosure;

DETAILED DESCRIPTION OF THE INVENTION

Figure 1:
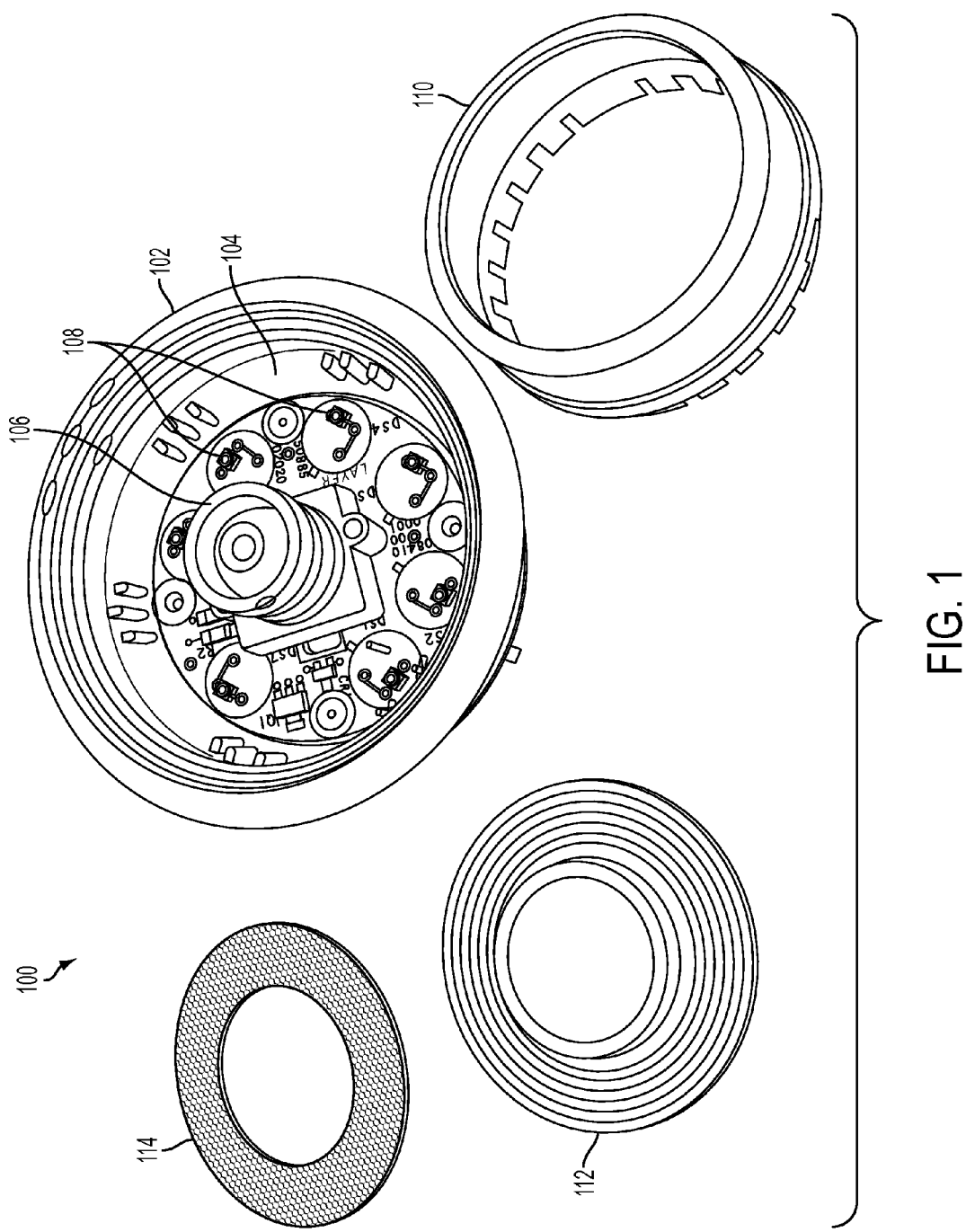
FIG. 1 is a diagram of a surveillance device in accordance with an embodiment of the disclosure.
Figure 2:
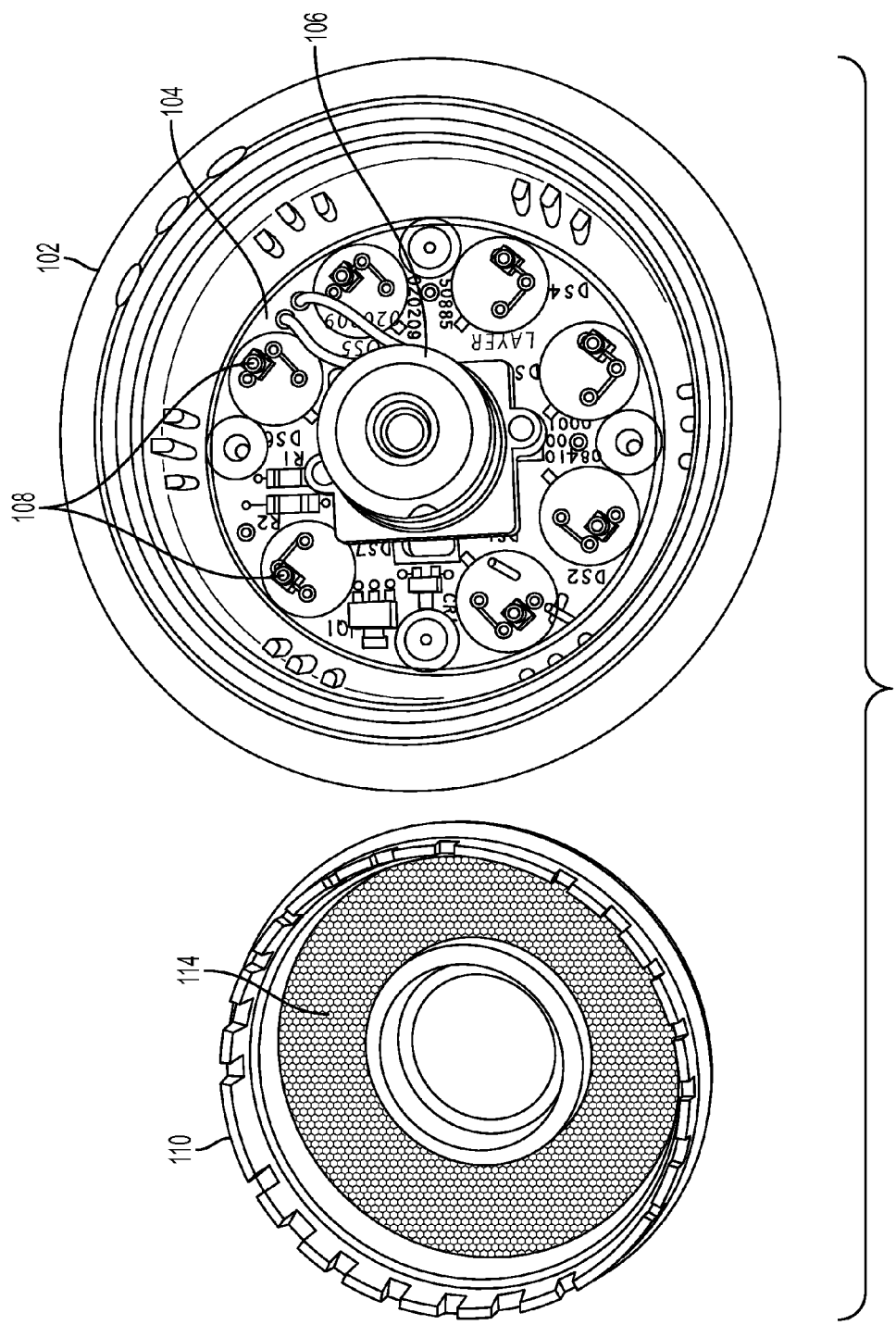
FIG. 2 is a diagram a surveillance device in accordance with an embodiment of the disclosure.

Referring now to FIG. 1 and FIG. 2, a diagram illustrating a surveillance device 100 in accordance with an embodiment is shown. As illustrated, the surveillance device 100 includes a first housing 102 and a circuit card assembly 104 disposed in the first housing 102. The circuit card assembly 104 includes lens/imager 106 and a plurality of light emitting diodes 108. In exemplary embodiments, the plurality of light emitting diodes 108 may be visible or near infrared light emitting diodes. In one embodiment, the circuit card assembly 104 is generally round in shape and the lens/imager 106 is disposed in the center of the circuit card assembly 104. In one embodiment, each of the plurality of light emitting diodes 108 may be disposed around the lens/imager 106 on the circuit card assembly 104. The surveillance device 100 also includes a diffuser 114 and a Fresnel lens 112 that are configured to fit inside of a second housing 110, which is removably affixed to the first housing 102. The Fresnel lens 112 may also serve as a front window of the surveillance device 100. In one embodiment, the distance between the circuit card assembly 104 and the opposing surface of the second housing 110 is approximately three quarters of an inch, or two centimeters.

In one embodiment, each of the plurality of light emitting diodes 108 is configured to emit a narrow beam of light in a direction generally perpendicular to the circuit card assembly 104. In one embodiment, the light emitting diodes 108 are configured to emit a beam of light with a Full Width Half Amplitude beam angle of approximately twenty degrees. The narrow beam of light emitted from the light emitting diodes 108 passes through the diffuser 114. The diffuser 114 is disposed between the light emitting diodes 108 and the Fresnel lens 112 and is configured to spread the narrow beams of light received from the light emitting diodes 108 and emit corresponding beams of light with a beam angle of approximately forty degrees. Next, these wider beams of light pass through the Fresnel lens 112, which is configured to further increase the beam angles to approximately sixty degrees and to direct each beam of light off of the center axis such that the light beams from the plurality of light emitting diodes 108 combine to form a solid angle of approximately one hundred and twenty degrees.

In one embodiment, the narrow beams of light emitted by the light emitting diodes 108 impact the diffuser 114 with a low angle of incidence, which reduces the amount of light that is reflected into the lens/imager assembly 106. Likewise, the low angle of incidence increases the amount of light passed through the diffuser 114 and increases the lighting efficiency of the illumination system. While the narrow beams of light produced by the light emitting diodes 108 increase the lighting efficiency of the illumination system, the narrow beams of light emitted by the light emitting diodes 108 are too narrow to fully illuminate the field of view for the lens/imager 106 of the surveillance device 100. Accordingly, the diffuser 114 and the Fresnel lens 112 are configured to spread the narrow beams of light emitted by the light emitting diodes 108 to provide optimal lighting for the lens/imager 106 of the surveillance device 100.

In one embodiment, the diffuser 114 is configured to spread the narrow beams of light received from the light emitting diodes 108 with specified divergence and to control the way light is distributed. In one embodiment, the specified divergence of the diffuser 114 is selected such that the beam angle of the narrow beam of light received from the light emitting diodes 108 is increased by a factor of two. For example, if the beam angle of the narrow beam of light received from the light emitting diodes 108 is twenty degrees, the beam angle of the light emitted by the diffuser 114 is forty degrees. The diffuser 114 may be constructed of a polymer-on-glass, injection-molded polymers, a fused silica, or the like. After the light passes through the diffuser 114 it then impacts the Fresnel lens 112 before leaving the surveillance device 100. In exemplary embodiments, the diffuser 114 may be incorporated on a surface of the Fresnel lens 114. The higher refractive index of the Fresnel lens 112 enhances the diffusion and redirection of the light while mitigating light loss due to reflection. Although the diffuser 114 is depicted as a micro-lens array diffuser, it will be understood by those of ordinary skill in the art that other types of diffuser could be used such as ground glass, opal glass, holographic, Engineered Diffuser™ etc. U.S. Pat. No. 7,033,736 discusses diffusers in detail, citing many prior diffuser patents.

Figure 3C:
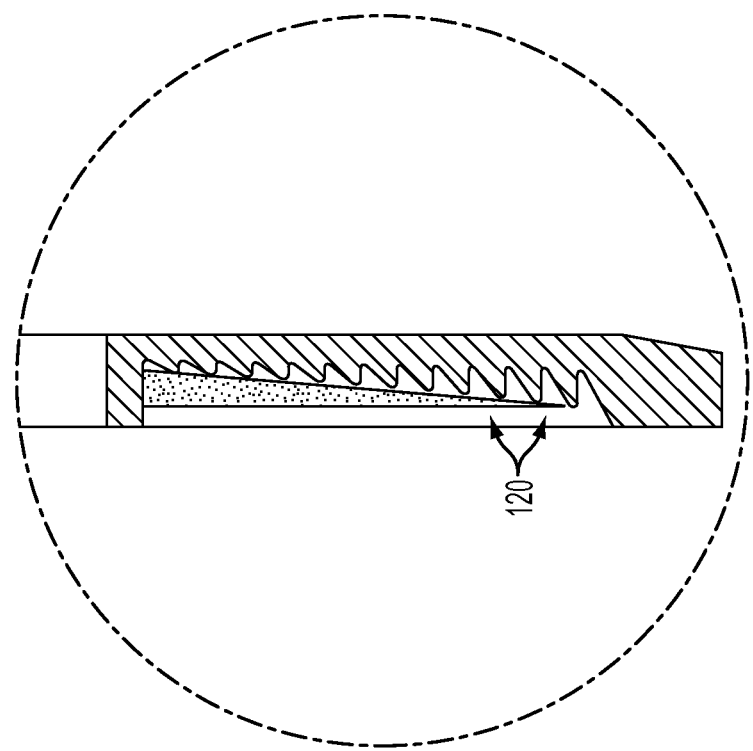
FIG. 3C is a cross-sectional side view of a portion of the Fresnel lens shown in FIG. 3B in accordance with an embodiment of the disclosure.
Figure 3B:
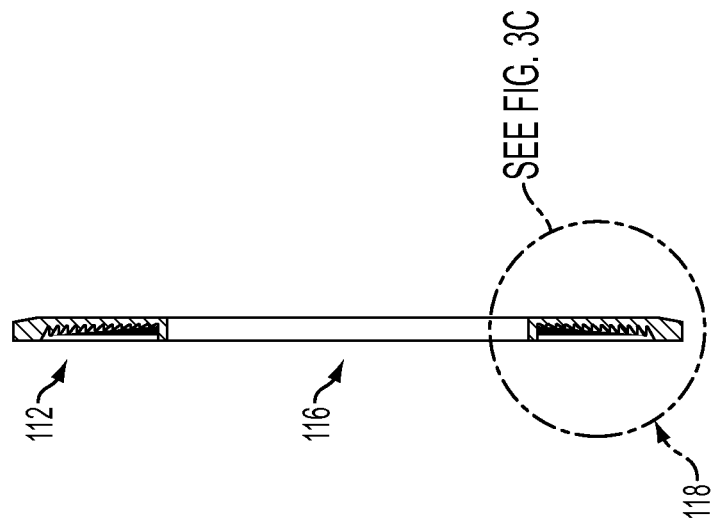
FIG. 3B is a cross-sectional side view of a Fresnel lens in accordance with an embodiment of the disclosure.

Referring now to FIGS. 3A, 3B and 3C, a Fresnel lens 112 in accordance with an embodiment of the disclosure is shown. The Fresnel lens 112 includes a center portion 116 and a perimeter portion 118. In one embodiment, the center portion 116 is configured to have a visible and near infra-red light window diameter just large enough to pass the full field of view of the lens/imager 106. The perimeter portion 118 includes a plurality set of concentric annular sections known as Fresnel zones 120. In each of the Fresnel zones 120, the thickness of the Fresnel lens 112 is decreased which effectively divides the continuous surface of a standard lens into a set of surfaces of the same curvature, with stepwise discontinuities between them. In general, the Fresnel lens 112 functions as an array of prisms arranged in a circular fashion, with steeper prisms on the edges of the perimeter portion 118 with an opening in the center portion 116. As will be appreciated by those of ordinary skill in the art, the Fresnel lens 112 may be a parabolic, conic or other aspherical surface to spread and redirect the light in any way desired. In exemplary embodiments, the perimeter portion 118 of the Fresnel lens 112 can be made of material largely opaque to visible light while transparent to infrared light to conceal the interior of the surveillance device 100, obscuring that surveillance device 100 is a video camera with infrared, or near infrared, illumination.

In one embodiment, the light emitting diodes 108 are circumferentially disposed on the circuit card assembly 104 around the lens/imager 106. In addition, the light emitting diodes 108 may be evenly spaced. For example if there are eight light emitting diodes 108, each of the light emitting diodes 108 may be separated by forty five degrees. In one embodiment, the plurality of light emitting diodes 108 includes seven light emitting diodes 108.

In one embodiment, the diffuser 114 and the Fresnel lens 112 are configured such that the narrow beams of light emitted by the light emitting diodes 108 are combined to form a beam of light that exits the surveillance device 100 with a beam angle of approximately one hundred and twenty degrees. In one embodiment, the diffuser 114 and the Fresnel lens 112 are configured such that the overlap of the light produced by each of the plurality of light emitting diodes 108 is minimized. Accordingly, the light produced by each of the plurality of light emitting diodes 108 corresponds to a portion of the approximately one hundred and twenty degree beam of light emitted from the surveillance device 100. In other embodiments, the diffuser 114 and the Fresnel lens 112 are configured such that the overlap of the light produced by each of the plurality of light emitting diodes 108 is set to a predetermined level. For example, the diffuser 114 and the Fresnel lens 112 may be configured such that the overlap of the light produced by each of the plurality of light emitting diodes 108 is approximately fifty percent. Accordingly, in the event of the failure of one of the light emitting diodes 108 no portion of the approximately one hundred and twenty degree beam of light emitted from the surveillance device 100 is completely dark.

In various embodiments, different numbers and configurations of light emitting diodes 108 may be used. In addition, the diffuser 114 and the Fresnel lens 112 may be configured to provide desired lighting conditions for the lens/imager 106.

Figure 4:
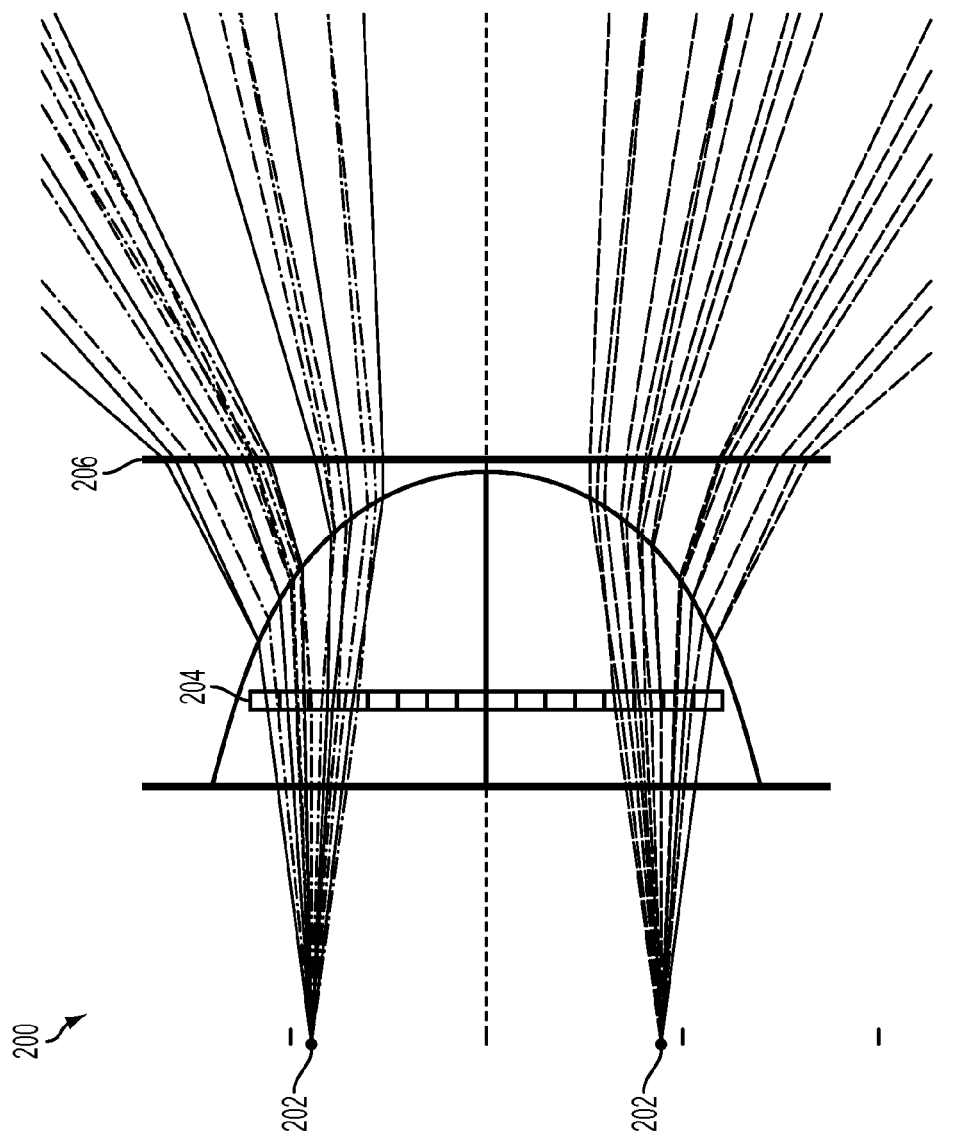
FIG. 4 is a diagram illustrating the light produced by an infrared illuminating device in accordance with an embodiment of the disclosure.

Referring now to FIG. 4, a diagram 200 illustrating the light produced by an infrared illuminating device in accordance with an embodiment of the disclosure is shown. As illustrated, light emitting diodes 202 produce a beam of light with a beam angle of approximately twenty degrees. The beams of light then pass through the diffuser 204 and the beam angle of the beams of light are increased. Next, the beams of light pass through the Fresnel lens 206 which further increase the beam angle of the light.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A surveillance device comprising:
   a circuit card assembly disposed in a housing;
   a lens/imager disposed in a center portion of the circuit card assembly;
   a plurality of light emitting diodes circumferentially disposed around the lens/imager on the circuit card assembly, each of the plurality of light emitting diodes configured to emit a narrow beam of light;
   a diffuser disposed in a second housing, the diffuser configured to spread the narrow beams of light; and
   a Fresnel lens disposed in the second housing, the Fresnel lens configured to spread and redirect the light emitted from the diffuser, the Fresnel lens comprises a center window having a diameter at least as wide as the lens/imager and a perimeter portion comprising a plurality of concentric annular sections, wherein the Fresnel lens is constructed of a material opaque to visible light and transparent to infrared light to conceal an interior of the surveillance device.

2. The surveillance device of claim 1, wherein the narrow beams of light emitted by the plurality of light emitting diodes have a beam angle of less than approximately forty degrees.

3. The surveillance device of claim 2, wherein the diffuser is configured to increase the beam angle of the narrow beams of light emitted by the plurality of light emitting diodes by more than a factor of two.

4. The surveillance device of claim 1, wherein the circuit card assembly has a generally circular shape.

5. The surveillance device of claim 1, wherein the Fresnel lens is configured to spread the light from the surveillance device with a beam angle of approximately one hundred and twenty degrees.

6. The surveillance device of claim 1, wherein the plurality of concentric annular sections each function to spread and redirect the light away from a central axis of the Fresnel lens.

7. A surveillance device comprising:
a circuit card assembly having a circular shape disposed in a housing;
a lens/imager disposed in the center of the circuit card assembly;
a plurality of infrared light emitting diodes circumferentially disposed on the circuit card assembly around the lens/imager, each of the plurality of infrared light emitting diodes configured to emit a narrow beam of infrared light;
a diffuser disposed in the housing, the diffuser configured to spread the narrow beam of infrared light; and
a Fresnel lens disposed in the housing, the Fresnel lens configured to spread and redirect the infrared light emitted from the diffuser, the Fresnel lens comprises a center window having a diameter at least as wide as the lens/imager and a perimeter portion comprising a plurality of concentric annular sections,
wherein the Fresnel lens is constructed of a material opaque to visible light and transparent to infrared light to conceal an interior of the surveillance device.

8. The surveillance device of claim 7, wherein the narrow beams of infrared light emitted by the plurality of infrared light emitting diodes have a beam angle of less than approximately forty degrees.

9. The surveillance device of claim 8, wherein the diffuser is configured to increase the beam angle of the narrow beams of light emitted by the plurality of infrared light emitting diodes by at least a factor of two.

10. The surveillance device of claim 7, wherein the Fresnel lens is configured to spread the infrared light from the surveillance device with a beam angle of approximately one hundred and twenty degrees.

11. The surveillance device of claim 7, wherein the perimeter plurality of concentric annular sections that function to spread and redirect the light away from the central axis.

* * * * *